(12) United States Patent
Yamazaki

(10) Patent No.: US 9,748,073 B2
(45) Date of Patent: Aug. 29, 2017

(54) ANALYSIS METHOD USING ELECTRON MICROSCOPE, AND ELECTRON MICROSCOPE

(71) Applicant: FUJITSU LIMITED, Kawasaki-shi, Kanagawa (JP)

(72) Inventor: Takashi Yamazaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/247,133

(22) Filed: Aug. 25, 2016

(65) Prior Publication Data

US 2016/0365220 A1 Dec. 15, 2016

Related U.S. Application Data

(63) Continuation of application No. PCT/JP2014/064530, filed on May 30, 2014.

(51) Int. Cl.
*H01J 37/00* (2006.01)
*H01J 37/22* (2006.01)
(Continued)

(52) U.S. Cl.
CPC ............ *H01J 37/222* (2013.01); *H01J 37/21* (2013.01); *H01J 37/22* (2013.01); *H01J 37/244* (2013.01);
(Continued)

(58) Field of Classification Search
CPC ........ H01J 37/222; H01J 37/265; H01J 37/28; H01J 37/244; H01J 37/21; H01J 37/22; H01J 2237/1534
(Continued)

(56) References Cited

U.S. PATENT DOCUMENTS

2013/0043386 A1* 2/2013 Yamazaki ............... H01J 37/28
250/307

FOREIGN PATENT DOCUMENTS

JP 2010-251041 11/2010
JP 2010-257883 11/2010
(Continued)

OTHER PUBLICATIONS

Espacenet Bibliographic Data, Japanese Publication No. 2010-251041, published Nov. 4, 2010.
(Continued)

*Primary Examiner* — Michael Maskell
(74) *Attorney, Agent, or Firm* — Staas & Halsey LLP

(57) ABSTRACT

An analysis method using an electron microscope, detects by a first electronography detector an electron beam transmitted through or scattered by a sample to detect an ADF image of the sample, detects by a second electronography detector the electron beam passing through the first electronography detector to detect an MABF image, adjusts a focal point of the electron beam to be located on the film of the sample to obtain first and second electronographies by the second and first electronography detectors, respectively, adjusts the focal point of the electron beam to be located on the substrate of the sample to obtain third and fourth electronographies by the second and first electronography detectors, respectively, aligns positions of the second and fourth electronographies based on the first and third electronographies, and after the aligning, subtracts the fourth electronography from the second electronography to obtain an image of the film.

14 Claims, 13 Drawing Sheets

(51) Int. Cl.
  *H01J 37/21* (2006.01)
  *H01J 37/244* (2006.01)
  *H01J 37/26* (2006.01)
  *H01J 37/28* (2006.01)
(52) U.S. Cl.
  CPC ............ *H01J 37/265* (2013.01); *H01J 37/28* (2013.01); *H01J 2237/1534* (2013.01)
(58) Field of Classification Search
  USPC .............................. 250/306, 307, 310, 311
  See application file for complete search history.

(56) References Cited

FOREIGN PATENT DOCUMENTS

| JP | 2012-43563 | 3/2012 |
| JP | 2013-41761 | 2/2013 |

OTHER PUBLICATIONS

Espacenet Bibliographic Data, Japanese Publication No. 2010-257883, published Nov. 11, 2010.
English Abstract for Japanese Publication No. 2012-43563, published Mar. 1, 2012.
Patent Abstracts of Japan, Publication No. 2013-41761, published Feb. 28, 2013.
Shibata et al., "Atomic-scale imaging of individual dopant atoms in a buried interface", Nature Materials, vol. 8, Aug. 2009, pp. 654-658.
International Search Report dated Jul. 1, 2014, in corresponding International Application No. PCT/JP2014/064530**.

* cited by examiner

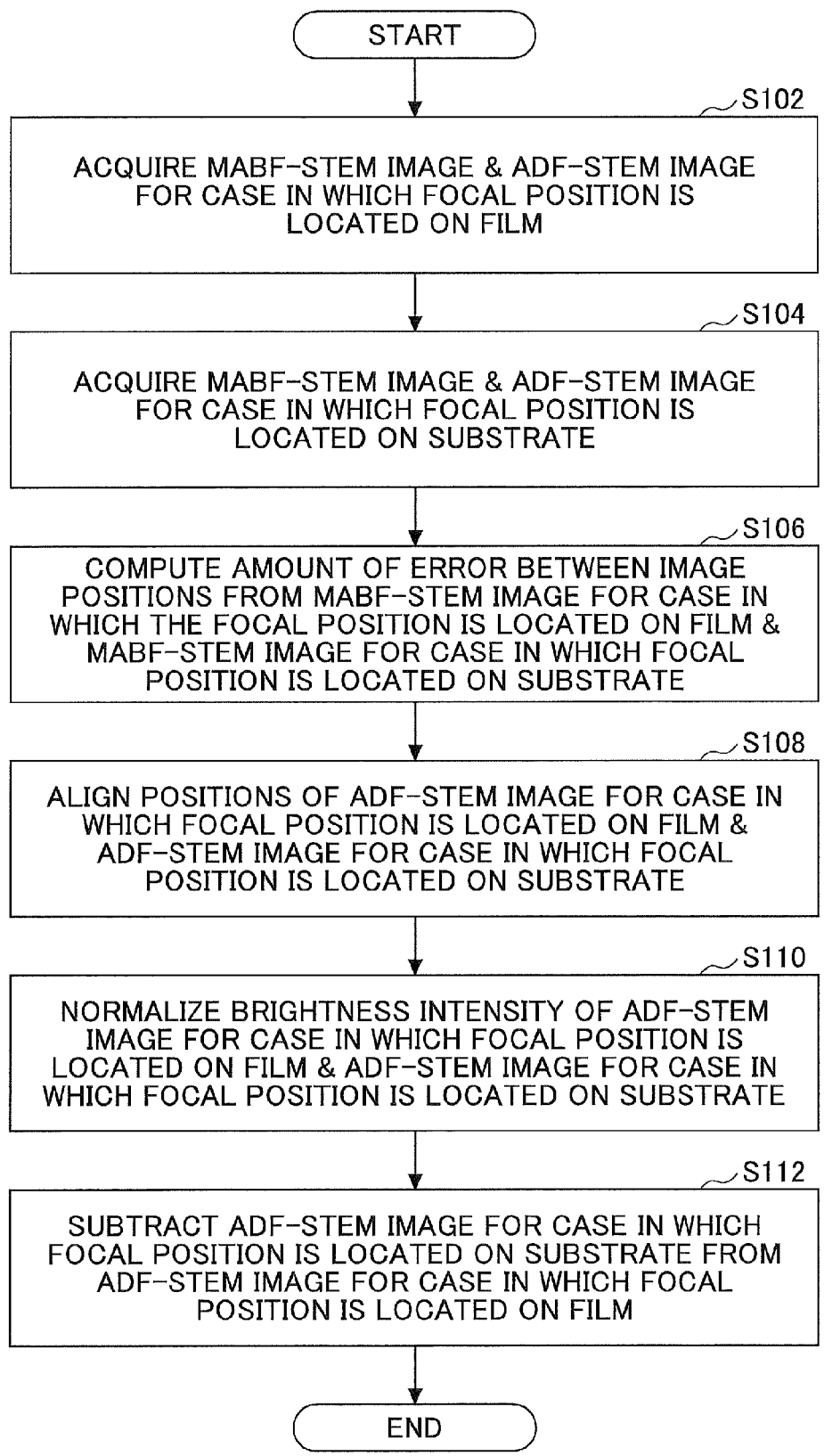

ANALYSIS METHOD USING ELECTRON MICROSCOPE, AND ELECTRON MICROSCOPE

CROSS-REFERENCE TO RELATED APPLICATIONS

This application is a continuation application of International Application No. PCT/JP2014/064530 filed on May 30, 2014 and designated the U.S., the entire contents of which are incorporated herein by reference.

FIELD

The embodiments discussed herein are related to an analysis method using electron microscope, and an electron microscope.

BACKGROUND

A TEM (Transmission Electron Microscope) and an STEM (Scanning Transmission Electron Microscope) are useful techniques for performing structural analysis and composition analysis at atomic levels of materials. However, the TEM acquires an image using an electron beam transmitted through a sample, and the structure in the acquired image reflects 2-dimensinoal symmetry. For this reason, there are demands to develop a method of acquiring a 3-dimensional tomogram using the TEM. Recently, development of a spherical aberration correcting apparatus enabled forming of an electromagnetic lens having a shallow DOF (Depth Of Field). Hence, by using the spherical aberration correcting apparatus and acquiring an image by varying a focal position, it is now possible to acquire the 3-dimensional tomogram. Actual observation examples using the spherical aberration correcting apparatus include pinpoint observation results of a boundary or a film deposited on a substrate surface reported in Japanese Laid-Open Patent Publication No. 2012-43563, and N. Shibata et al., "Atomic-scale imaging of individual dopant atoms in a buried interface", Nature Materials, Vol. 8, August 2009, pp. 654-658, for example.

However, when acquiring the 3-dimensional tomogram using the TEM or the like, accurate positional relationship, and definite atomic deviation and distortion are required of the image that is acquired at each of a plurality of depth positions. For example, in the case of the sample in which a film made of a material having a composition different from that of a substrate is deposited on the substrate, it may be important to definitely know the relationship at the atomic level between the substrate and the film, and the atomic deviation and distortion of the film. However, according to a method proposed in Japanese Laid-Open Patent Publication No. 2012-43563, for example, the images at each of the substrate and the film are acquired by varying the focal position, and the sample moves (or drifts) at the atomic level while the focal position is varied. In a case in which the sample moves at the atomic level while the focal position is varied, it is difficult to detect the atomic deviation and distortion between the substrate and the film. In addition, because the film that is deposited on the substrate is thin, information of the substrate is included in the image of the film that is acquired, thereby making it difficult to detect the atomic deviation and distortion of the film deposited on the substrate.

SUMMARY

Accordingly, it is an object in one aspect of the embodiments to provide an analysis method using electron microscope, and an electron microscope, which can definitely detect the atomic deviation and distortion of the film that is deposited on the substrate.

According to one aspect of the embodiments, an analysis method uses an electron microscope including an electron source, a first electronography detector, and a second electronography detector, and includes accelerating and irradiating an electron beam emitted from the electron source on a sample so that a focal point of the electron beam is located on the sample, wherein the sample includes a substrate that includes fluorine or an element lighter than fluorine, and a film formed on a surface of the substrate; detecting, by the first electronography detector, the electron beam transmitted through or scattered by the sample, to detect an ADF (Annular Dark-Field) image of the sample; detecting, by the second electronography detector, the electron beam passing through the first electronography detector, to detect an MABF (Middle-Angle Bright-Field) image, adjusting the focal point of the electron beam to be located on the film of the sample, to obtain a first electronography by the second electronography detector and a second electronography by the first electronography detector; adjusting the focal point of the electron beam to be located on the substrate of the sample, to obtain a third electronography by the second electronography detector and a fourth electronography by the first electronography detector; aligning positions of the second electronography and the fourth electronography, based on the first electronography and the third electronography; and after the aligning, performing an image computation to subtract the fourth electronography from the second electronography, to obtain an image of the film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a flow chart for explaining the analysis method using the electron microscope in one embodiment;

DESCRIPTION OF EMBODIMENTS

Figure 1:
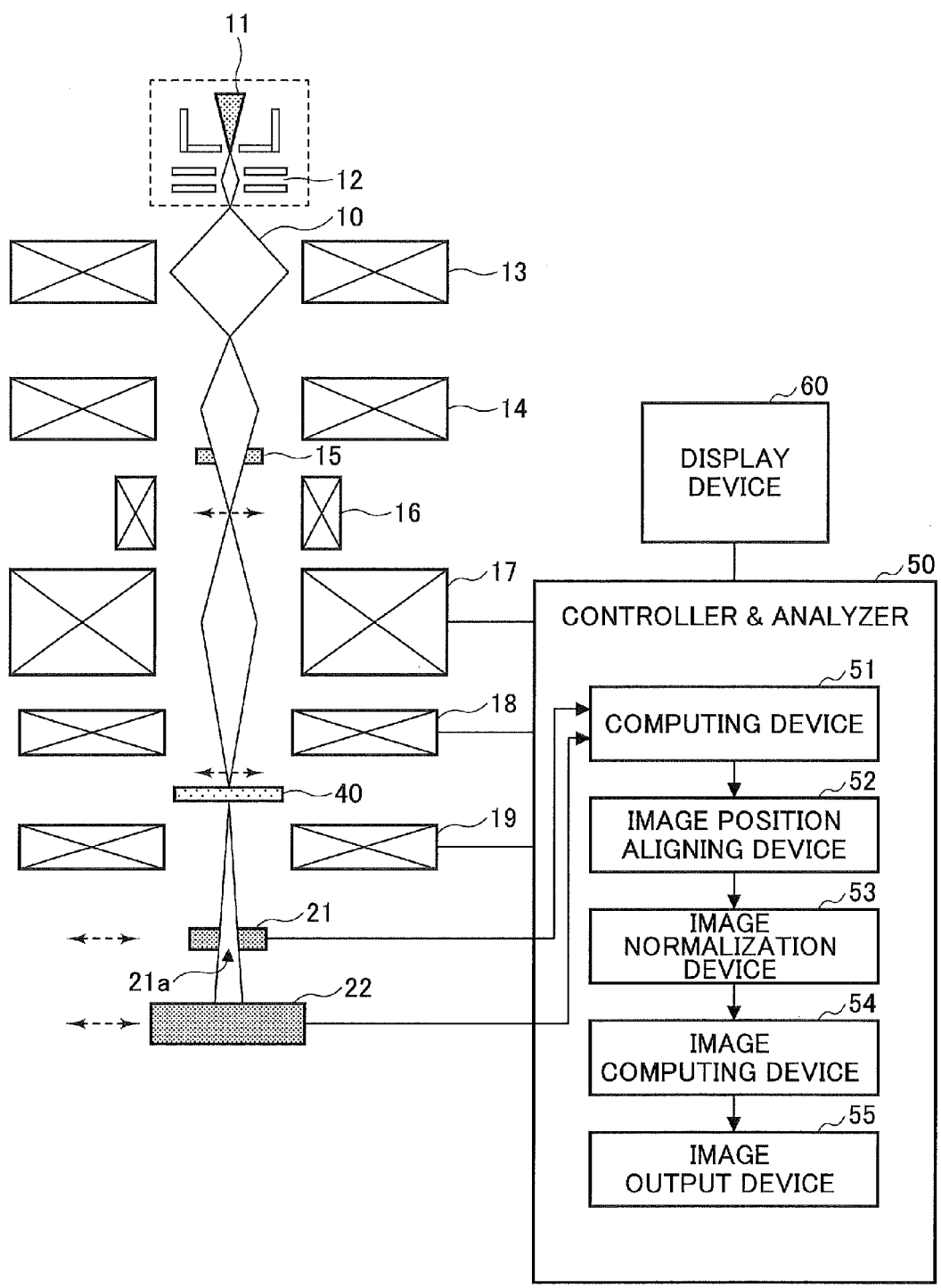
FIG. 1 is a diagram illustrating a configuration of an electron microscope in one embodiment.

Preferred embodiments of the present invention will be described with reference to the accompanying drawings.

A description will now be given of the analysis method using the electron microscope, and the electron microscope, in each embodiment according to the present invention. In the drawings, those parts that are the same are designated by the same reference numerals, and a description of the same parts will not be repeated.

(STEM)

First, a description will be given of the STEM in one embodiment, by referring to FIG. 1. In one embodiment, the STEM is a CSTEM (Confocal STEM) that includes a field emission electron gun 11 and a accelerator 12. The field emission electron gun 11 is an example of an electron source that emits an electron beam 10. The accelerator 12 accelerates the electron beam 10 emitted from the field emission electron gun 11.

The electron beam 10 that is accelerated by the accelerator 12 is converged by convergent lenses 13 and 14, and an irradiation half-angle of the electron beam 10 that is irradiated on a sample 40 is thereafter adjusted by a convergent lens limiter 15. FIG. 1 illustrates an example in which a focusing lens has a 2-stage configuration including the convergent lenses 13 and 14. An electron beam probe including the converted electron beam 10 is deflected by scan coils 16 that form an example of an electron beam scanner. The electron beam probe further passes through a spherical aberration corrector 17, and is thereafter formed into a micro-electron beam probe by an objective lens 18 and is irradiated on the sample 40. In this STEM, the electron beam 10 can be caused to scan by deflecting the electron beam 10 by the scan coils 16. Atomic images or the like forming the sample 40 may be obtained by scanning by the sample 40 by the electron beam 10. The spherical aberration corrector 17 is an example of the spherical aberration correcting apparatus described above, and can correct spherical aberration and chromatic aberration of the electron beam 10. The spherical aberration corrector 17 can reduce a spherical aberration coefficient to 1 µm or less. Although the focusing lens of the STEM illustrated in FIG. 1 has the 2-stage configuration including the convergent lenses 13 and 14, the focusing lens may have a multi-stage configuration that includes 3 or more stages.

Figure 2:
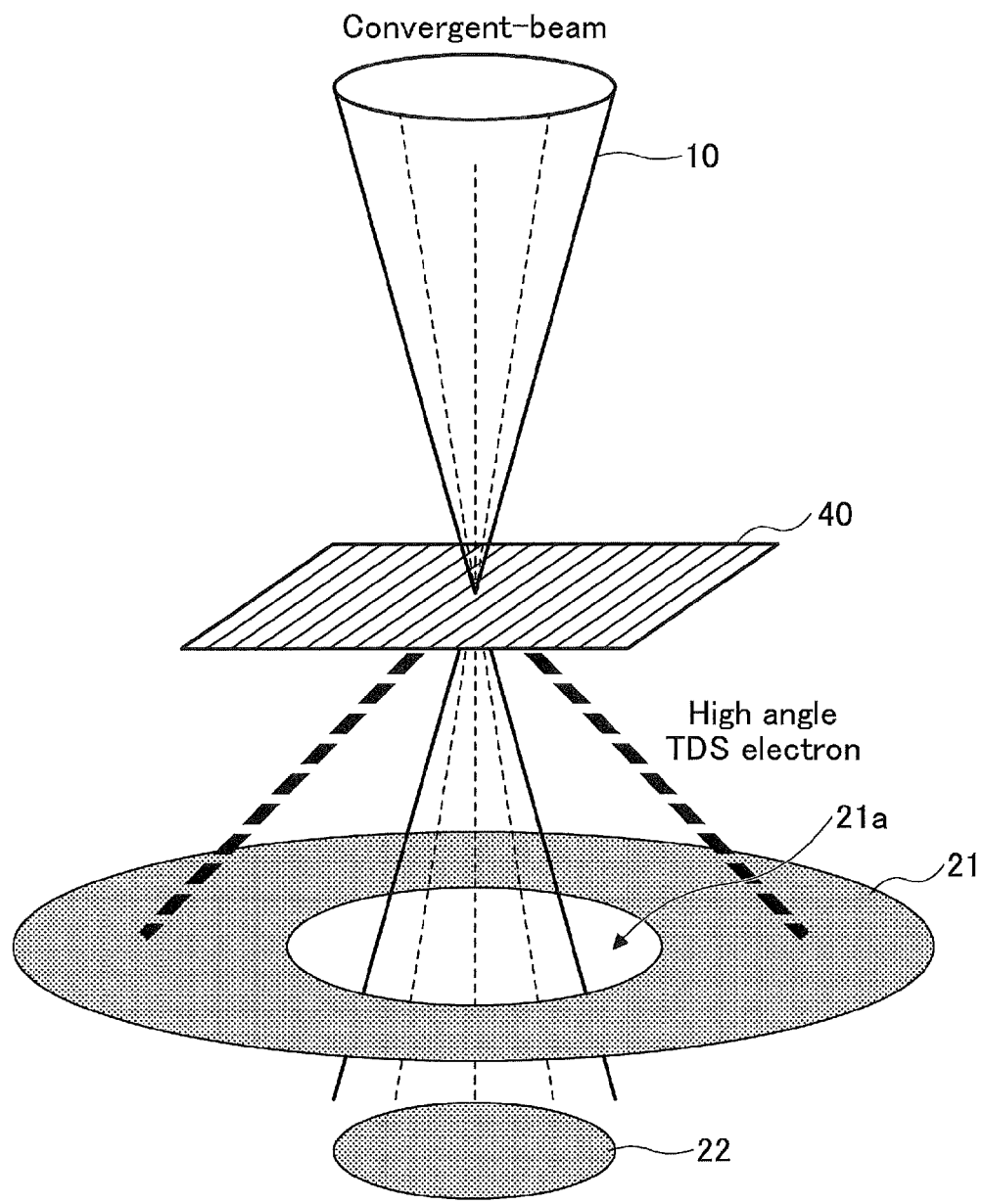
FIG. 2 is a diagram for explaining the electron microscope in one embodiment.

By adjusting the convergent lenses 13 and 14, the electron beam 10 that is adjusted of its focal position and formed into the micro-electron beam probe, is irradiated on the sample 40. The micro-electron beam probe is transmitted through the sample 40 or is scattered at the sample 40. The electron beam that is transmitted through or is scattered at the sample 40, passes through a projection lens 19, and is detected by a first electronography detector 21 and a second electronography detector 22 that are arranged at stages subsequent to the sample 40. The first electronography detector 21 detects an ADF-STEM image, and has a ring shape with an aperture 21a at a center part thereof. The second electronography detector 22 detects an MABF (Middle-Angle Bright-Field)-STEM image. The second electronography detector 22 is configured to detect the electron beam passing through the aperture 21a of the first electronography detector 21. FIG. 2 is a diagram illustrating the electron beam 10 irradiated on the sample 40, and a relationship between the first electronography detector 21 and the second electronography detector 22.

The STEM in one embodiment includes a controller and analyzer 50. The controller and analyzer 50 includes a computing device 51 that computes an amount of error between image positions, an image position aligning device 52, an image normalization device 53, an image computing device 54, and an image output device 55. Image information that is output from the image output device 55 is displayed on a display device 60 that is connected to the controller and analyzer 50. The controller and analyzer 50 has functions to control the convergent lenses 13 and 14, the spherical aberration corrector 17, the objective lens 18, the projection lens 19, or the like. The controller and analyzer 50 may control the scan coils 16. In addition, the control and analyzer 50 has functions to perform an analysis or the like based on information detected by the first electronography detector 21 and the second electronography detector 22.

The controller and analyzer 50 may be formed by a processor that performs processes of the computing device 51, the image position aligning device 52, the image normalization device 53, the image computing device 54, and the image output device 55.

(Analysis Method of Electron Microscope)

Figure 3:
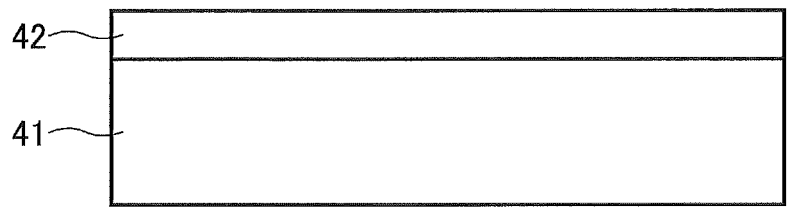
FIG. 3 is a diagram illustrating a configuration of a sample that is analyzed by the electron microscope in one embodiment.
Figure 4:
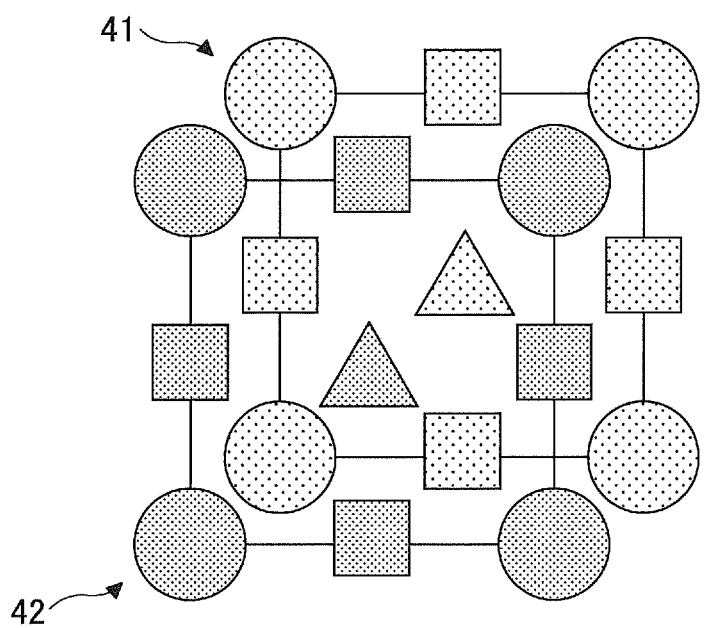
FIG. 4 is a diagram for explaining a simulation model of the sample.

Next, a description will be given of the analysis method of the electron microscope in one embodiment. When performing the analysis method using the electron microscope in one embodiment, the sample 40 is a target of the analysis. The sample 40 includes a substrate 41 that is made of a crystal formed by an oxide or the like, and a film 42 that is formed on a surface of the substrate 41 by crystal growth of a material different from the material forming the substrate 41, as illustrated in FIG. 3. In one embodiment, the substrate 41 is formed by a material including an element lighter than fluorine. For example, the material forming the substrate 41 may be an oxide, a nitride, a fluoride, carbide, or the like.

In the STEM in one embodiment illustrated in FIG. 1, it is possible to simultaneously obtain the ADF-STEM image by the first electronography detector 21 and the MABF-STEM image by the second electronography detector 22. In general, the ADF-STEM is an observation method by which a high intensity appears at a position where a heavy element exists, and the MABF-STEM is an observation method by which a high intensity appears at a position where a light element exists.

The analysis method using the electron microscope in one embodiment acquires information of atomic positions by irradiating the electron beam perpendicularly with respect to a substrate surface of the sample 40. Hence, the substrate 41 and the film 42 exist along an incident direction of the electron beam. For this reason, in a case in which the focal position of the electron beam is located on the film 42, information of the heavy element included in the material forming the film 42 and information of the heavy element included in the material forming the substrate 41 may simultaneously appear in the ADF-STEM image. In other words, in the case in which the focal position of the electron beam is located on the film 42, not only the information of the heavy element included in the material forming the film 42, but also the information of the heavy element included in the material forming the substrate 41 may simultaneously appear in the ADF-STEM image. In this case, it is impossible to obtain only the information of the film 42. Such a phenomenon becomes more conspicuous as the thickness of the film 42 becomes thinner.

In addition, in the MABF-STEM image, information of the light element having a higher percentage in the entire sample 40 appear more conspicuously. Accordingly, in a case in which the substrate 41 is thick compared to the film 42, the information of the light element included in the material forming the substrate 41 appears as main information in the MABF-STEM image, even when the focal position of the electron beam is located on the film 42.

In a case in which the focal position of the electron beam is located on the substrate 41, the information of the heavy element included in the material forming the substrate 41 appears in the ADF-STEM image. In addition, in the case in which the focal position of the electron beam is located on the film 42, the information of the light element included in the material forming the substrate 41 appears as the main information in the MABF-STEM image.

As described above, when the focal position of the electron beam is moved from the substrate 41 to the film 42, a drift generally occurs, and the observation position deviates at the atomic level. In one embodiment, the ADF-STEM image and the MABF-STEM image are simultaneously obtained at the same focal position of the electron beam, and there is no positional error of the images between the ADF-STEM image and the MABF-STEM image. Further, in the case of the MABF-STEM image, even when the focal position of the electron beam is changed from the substrate 41 to the film 42, there is no change in the observed information of the light element. Accordingly, in one embodiment, the positional error of the images is corrected based on the MABF-STEM image for the case in which the focal position of the electron beam is located on the substrate 41 and the MABF-STEM image for the case in which the focal position of the electron beam is located on the film 42. As a result, it is possible to accurately align (or match positions of) the ADF-STEM image for the case in which the focal position of the electron beam is located on the substrate 41 and the ADF-STEM image for the case in which the focal position of the electron beam is located on the film 42.

As described above, the information of the heavy element included in the material forming the film 42 and the information of the heavy element included in the material forming the substrate 41 may simultaneously appear in the ADF-STEM image for the case in which the focal position of the electron beam is located on the film 42. Only the information of the heavy element included in the material forming the substrate 41 appears in the ADF-STEM image for the case in which the focal position of the electron beam is located on the substrate 41. Accordingly, in one embodiment, the alignment (or position matching) of the ADF-STEM image for the case in which the focal position of the electron beam is located on the film 42 and the ADF-STEM image for the case in which the focal position of the electron beam is located on the substrate 41 is performed, based on the MABF-STEM image for the case in which the focal position of the electron beam is located on the film 42 and the MABF-STEM image for the case in which the focal position of the electron beam is located on the substrate 41. Thereafter, an image computation is performed by subtracting the ADF-STEM image for the case in which the focal position of the electron beam is located on the substrate 41 from the ADF-STEM image for the case in which the focal position of the electron beam is located on the film 42. As a result, it is possible to obtain, as an image, the information of the position of the heavy element included in the material forming the film 42.

In other words, in one embodiment, the analysis method first obtains the MABF-STEM image and the ADF-STEM image for the case in which the focal position of the electron beam is located on the film 42, and the MABF-STEM image and the ADF-STEM image for the case in which the focal position of the electron beam is located on the substrate 41. Thereafter, the analysis method performs the image computation between the ADF-STEM image for the case in which the focal position of the electron beam is located on the film 42 from the ADF-STEM image for the case in which the focal position of the electron beam is located on the substrate 41, to obtain the image information of the film 42.

In the case of a high-resolution STEM image, the electron beam that is converged to nm order or less is irradiated on the sample 40 and diffracted at the sample 40. Electrons reaching a ring-shaped ADF detector that is provided at a diffraction image surface are counted. The counted number of electrons is synchronized to the position of the incident electrons, and used as an intensity of the image. Such an operation is performed while causing the converged electron beam to scan, to thereby obtain a 2-dimensional dark-field STEM image. This 2-dimensional dark-field STEM image is generally referred to as an HAADF (High-Angle Annular Dark-Field)-STEM image, which is a type of ADF-STEM image. According to the HAADF-STEM image, an intensity corresponding to an atomic number of an element of an atom is obtained at the position of the atom. In addition, because a contrast of the image is considerably insensitive to a focal point of the electromagnetic lens that converges the electron beam, and to the thickness of the sample, it is possible to obtain an image having a superior direct viewing of the atom. In the CSTEM, a spatial resolution of the image depends on a diameter of the converged electron beam, and in the case in which the spherical aberration correcting apparatus is used, the spatial resolution can be reduced to 1 μm or less. Because of these features, the CSTEM is popularly used also for the structural analysis.

In one embodiment, the ring-shaped first electronography detector 21 is used when detecting the HAADF-STEM image. Accordingly, the electron beam passing through the aperture 21a formed at the center part of the first electronography detector 21 is detected by the disk-shaped second electronography detector 22. The image that is obtained from the electron beam detected by the disk-shaped second electronography detector 22 is generally referred to as a BF (Bright-Field)-STEM image. Characteristics of the BF-STEM image greatly changes according to beam acquiring conditions that are set for the disk-shaped second electronography detector 22. The image that is obtained by setting a beam acquiring angle to a large angle is generally known as a complementary image of the HAADF-STEM image, and is categorized as a HABF (High-Angle Bright-Field)-STEM image. In addition, a BF-STEM image that is obtained by setting the beam acquiring angle to a medium angle on the order of 9 mrad (milli-radians) to 12 mrad is categorized as an MABF-STEM image, and it is known that the image is bright at the position of the light element.

Next, a description will be given of a simulation of the analysis method using the electron microscope in one embodiment. This simulation employs a model of the sample 40 having a configuration that includes an $SrTiO_3$ crystal substrate as the substrate 41, and an $LaCoO_3$ crystal film that is formed as the film 42 on the substrate 41 by crystal growth. In addition, in the model of the sample 40, the substrate 41 has a thickness of 68 nm, and the film 42 has a thickness of 12 nm, and the atomic positions in the substrate 41 and the film 42 are shifted by (1/4 1/4 0) with reference to a unit cell. The incident direction of the electron beam is set to a [001] direction, and the method of acquiring the 3-dimensional tomogram is similar to the method proposed in Japanese Laid-Open Patent Publication No. 2012-43563. Because the electron beam formed by the electromagnetic lens and subjected to the spherical aberration correction has a considerably shallow DOF, the method proposed in Japanese Laid-Open Patent Publication No. 2012-43563 obtains the image by varying the focal point of the electromagnetic lens so that the focal point is located at a part that is the observation target.

Figure 5:
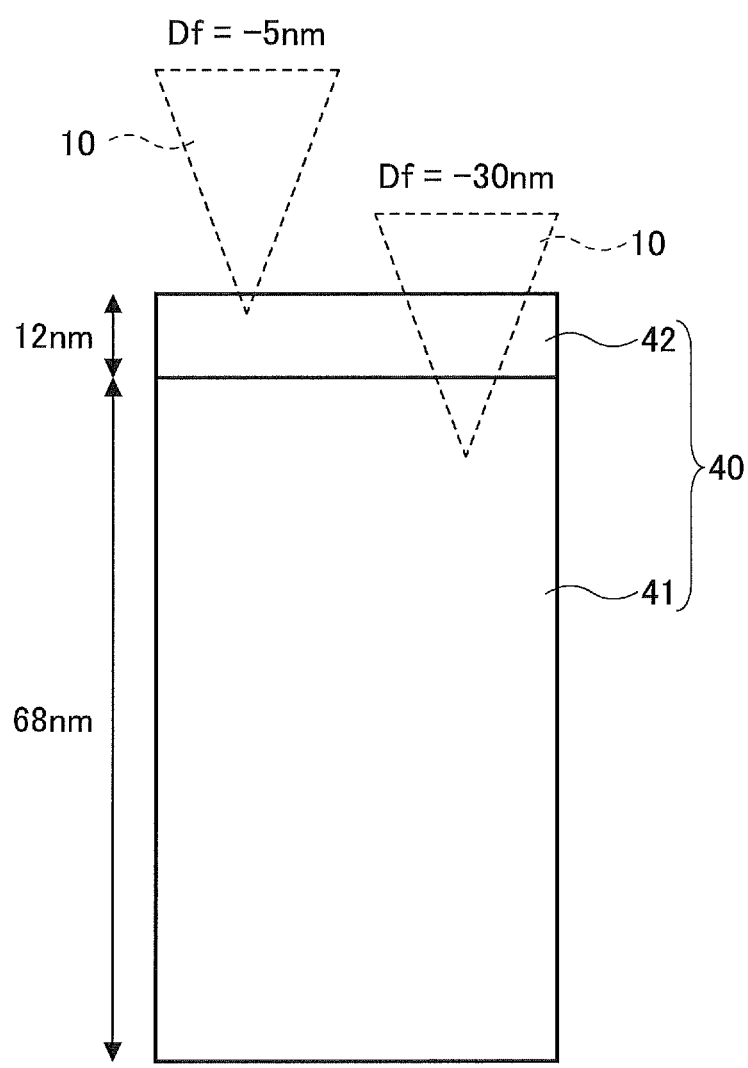
FIG. 5 is a diagram for explaining a simulation.
Figure 6A:
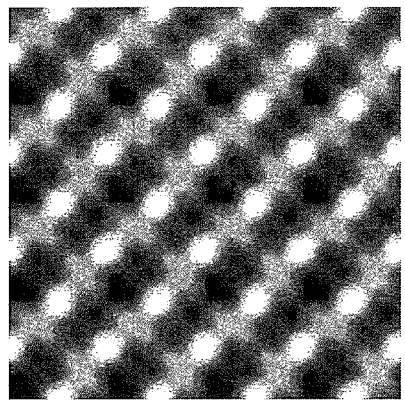
FIGS. 6A, 6B, 6C, and 6D are diagrams illustrating electronographies obtained by the simulation.
Figure 6B:
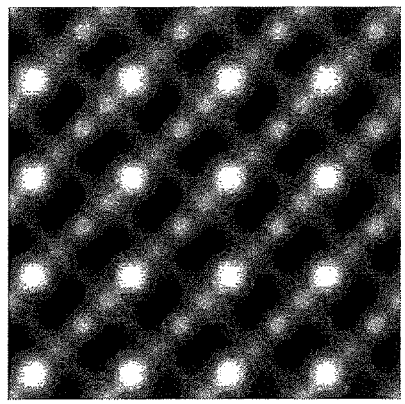
Figure 6C:
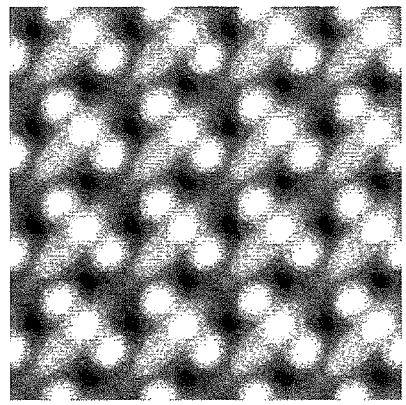
Figure 6D:
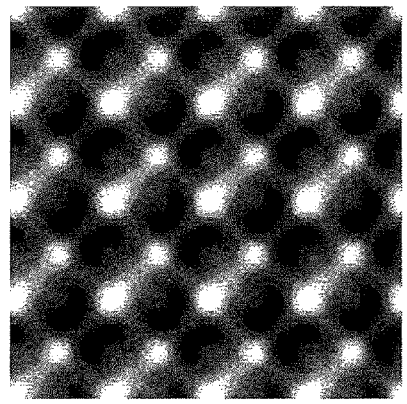

As illustrated in FIG. 5, in the case in which the focal position of the electron beam is located on the film 42, the computation is performed in a defocused state so that the focal point is located at a position having a depth of 5 nm from the surface of the film 42 in the sample 40 in a direction (hereinafter also referred to as a "depth direction") in which the depth is taken (Df=−5 nm in FIG. 5). On the other hand, in the case in which the focal position of the electron beam is located at the substrate 41, the computation is performed in the defocused state so that the focal point is located at a position having a depth of 30 nm from the surface of the film 42 in the sample 40 in the depth direction (Df=−30 nm in FIG. 5). FIGS. 6A and 6B are diagrams illustrating electronographies obtained by the simulation for the case in which the focal position of the electron beam is located on the film 42. More particularly, FIG. 6A illustrates an MABF-STEM image for the case in which the focal position of the electron beam is located at the position having the depth of 5 nm in the depth direction from the surface of the film 42 in the sample 40. On the other hand, FIG. 6B illustrates an ADF-STEM image for the case in which the focal position of the electron beam is located at the position having the depth of 5 nm in the depth direction from the surface of the film 42 in the sample 40. FIGS. 6C and 6D are diagrams illustrating electronographies obtained by the simulation for the case in which the focal position of the electron beam is located on the substrate 41. More particularly, FIG. 6C illustrates an MABF-STEM image for the case in which the focal position of the electron beam is located at the position having the depth of 30 nm in the depth direction from the surface of the film 42 in the sample 40. On the other hand, FIG. 6D illustrates an ADF-STEM image for the case in which the focal position of the electron beam is located at the position having the depth of 30 nm in the depth direction from the surface of the film 42 in the sample 40.

In one embodiment, the MABF-STEM image illustrated in FIG. 6A may be referred to as a first electronography, and the ADF-STEM image illustrated in FIG. 6B may be referred to as a second electronography. In addition, the MABF-STEM image illustrated in FIG. 6C may be referred to as a third electronography, and the ADF-STEM image illustrated in FIG. 6D may be referred to as a fourth electronography.

Figure 7A:
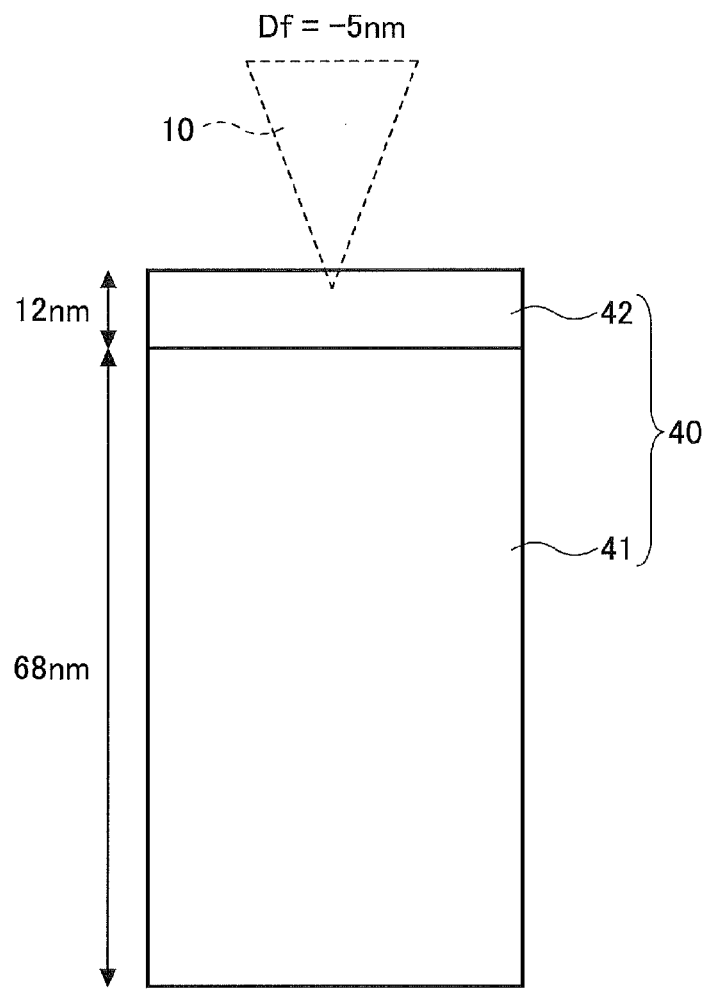
FIGS. 7A, 7B, and 7C are diagrams for explaining a case in which a focal position of an electron beam is located on a film of the sample.
Figure 7B:
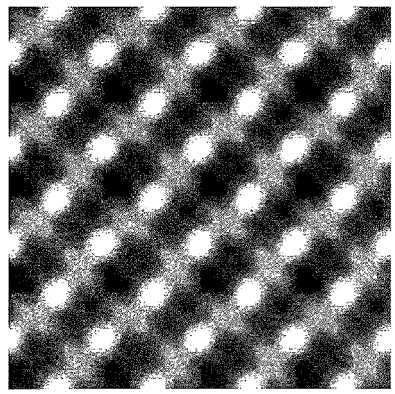
Figure 7C:
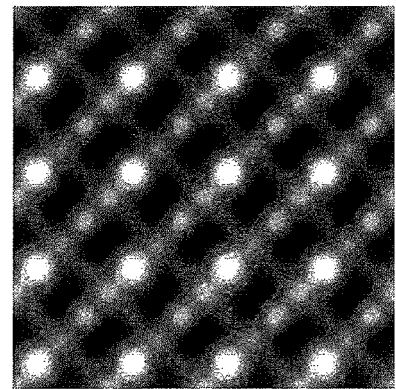

Next, a more detailed description will be given of the STEM images that are obtained. FIG. 7A illustrates a state for the case in which the focal position of the electron beam is located on the film 42, that is, the focal position of the electron beam is located at the position having the depth of 5 nm in the depth direction from the surface of the sample 40 (Df=−5 nm in FIG. 7A). FIG. 7B illustrates an MABF-STEM image (first electronography) that is obtained in this case, and FIG. 7C illustrates an ADF-STEM image (second electronography) that is obtained in this case. In the MABF-STEM image (first electronography) illustrated in FIG. 7B, the position of the light element in the substrate 41, that is, the position of the oxygen (O) in the $SrTiO_3$ forming the substrate 41, appears brightest. In addition, in the ADF-STEM image (second electronography) illustrated in FIG. 7C, the position of the heavy element in the substrate 41 and the position of the heavy element in the film 42 appear bright. In other words, the positions of Sr and Ti in the $SrTiO_3$ forming the substrate 41, and the positions of La and Co in the $LaCoO_3$ forming the film 42, appear bright in the ADF-STEM image (second electronography) illustrated in FIG. 7C. This is because thermal diffuse scattering electrons scattered from the heavy elements existing at the focal position of the electron beam are detected in the ADF-STEM image (second electronography) illustrated in FIG. 7C, and the heavy elements at the focal position mainly appear in the image. On the other hand, in the MABF-STEM image (first electronography) illustrated in FIG. 7B, the position of the light element in the substrate 41 appear brightest, because in the entire sample 40, the position where the amount of light element is the largest appears brightest in the image.

Figure 8A:
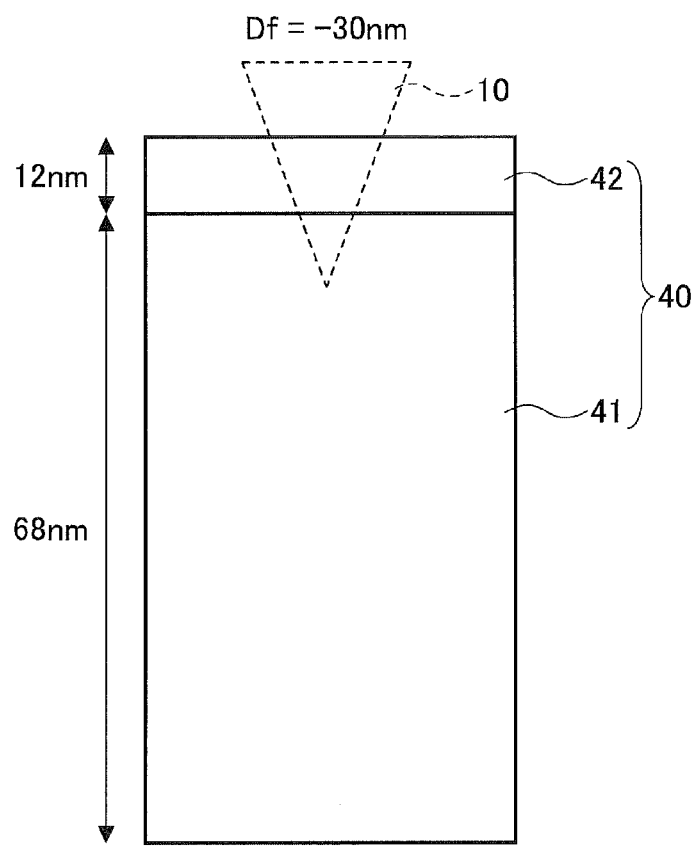
FIGS. 8A, 8B, and 8C are diagrams for explaining a case in which the focal position of the electron beam is located on a substrate of the sample.
Figure 8B:
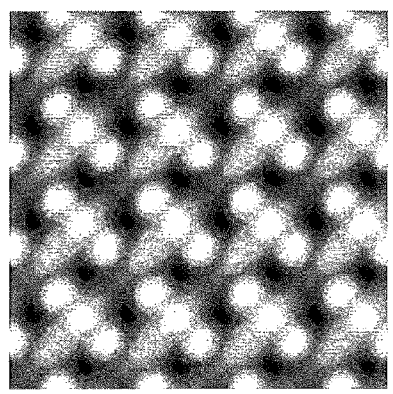
Figure 8C:
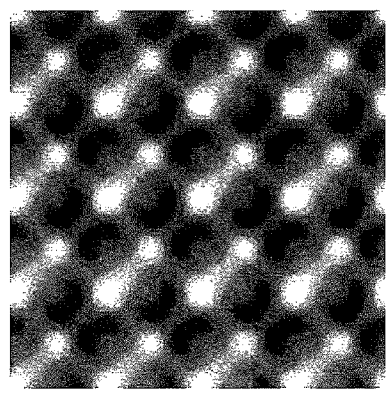

FIG. 8A illustrates a state for the case in which the focal position of the electron beam is located on the substrate 41, that is, the focal position of the electron beam is located at the position having the depth of 30 nm in the depth direction from the surface of the sample 40 Df=−30 nm in FIG. 8A). FIG. 8B illustrates an MABF-STEM image (third electronography) that is obtained in this case, and FIG. 8C illustrates an ADF-STEM image (fourth electronography) that is obtained in this case. In the MABF-STEM image (third electronography) illustrated in FIG. 8B, the position of the light element in the substrate 41, that is, the position of the oxygen (O) in the $SrTiO_3$ forming the substrate 41, appears brightest. In addition, in the ADF-STEM image (fourth electronography) illustrated in FIG. 8C, the position of the heavy element in the substrate 41, that is, the positions of Sr and Ti in the $SrTiO_3$ forming the substrate 41, appear bright.

Figure 9C:
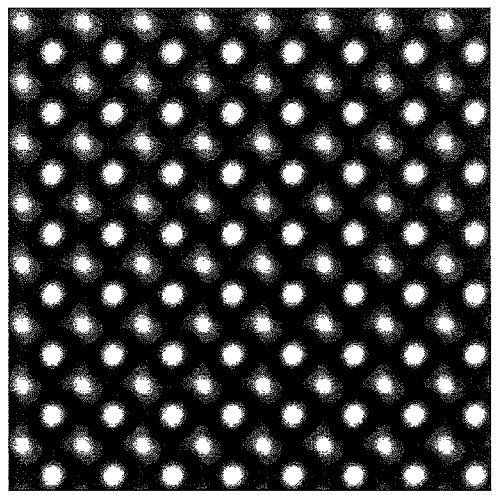
FIGS. 9A, 9B, and 9C are diagrams for explaining an analysis method using the electron microscope in one embodiment.
Figure 9B:
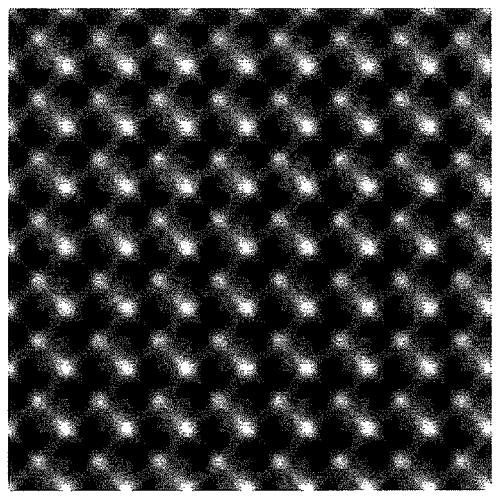
Figure 9A:
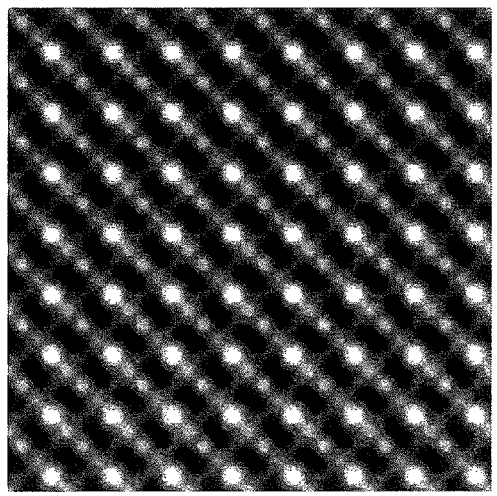

In one embodiment, the amount of error between the image positions is first computed from the MABF-STEM image (first electronography) for the case in which the focal position of the electron beam is located on the film 42 and the MABF-STEM image (third electronography) for the case in which the focal position of the electron beam is located on the substrate 41. Thereafter, the ADF-STEM image (second electronography) for the case in which the focal position of the electron beam is located on the film 42 and the ADF-STEM image (fourth electronography) for the case in which the focal position of the electron beam is located on the substrate 41 are relatively shifted by the computed amount of error between the image positions. Hence, it is possible to match the positions of the ADF-STEM image (second electronography) for the case in which the focal position of the electron beam is located on the film 42 and the ADF-STEM image (fourth electronography) for the case in which the focal position of the electron beam is located on the substrate 41. Thereafter, the brightness of the image is normalized in the ADF-STEM image (second electronography) for the case in which the focal position of the electron beam is located on the film 42 and the ADF-STEM image (fourth electronography) for the case in which the focal position of the electron beam is located on the substrate 41. Thereafter, an image computation is performed to subtract the ADF-STEM image (fourth electronography) illustrated in FIG. 9B for the case in which the focal position of the electron beam is located on the substrate 41 from the ADF-STEM image (second electronography) illustrated in FIG. 9A for the case in which the focal position of the electron beam is located on the film 42. As a result of this image computation, an image illustrated in FIG. 9C is obtained. The image illustrated in FIG. 9C indicates the structure of the film 42, that is, the positions of the heavy elements La and Co in $LaCoO_3$ forming the film 42.

The method of computing the amount of error between the image positions from the MABF-STEM image for the case in which the focal position of the electron beam is located on the film 42 and the MABF-STEM image for the case in which the focal position of the electron beam is located on the substrate 41, may include the correlation method, the phase-only correlation method, or the like.

Next, a description will be given of the analysis method using the electron microscope in one embodiment, by referring to the flow chart illustrated in FIG. 10.

First, in step S102, the MABF-STEM image (first electronography) for the case in which the focal position of the electron beam is located on the film 42 and the ADF-STEM image (second electronography) for the case in which the focal position of the electron beam is located on the film 42 are acquired. More particularly, the electron beam is irradiated by adjusting the focal position of the electron beam to be located on the film 42 of the sample 40, and the electron beam that is transmitted through the sample 40, or scattered in the sample 40, is detected by the first electronography detector 21 and the second electronography detector 22. Hence, the MABF-STEM image (first electronography) for the case in which the focal position of the electron beam is located on the film 42 is detected by the second electronography detector 22. In addition, the ADF-STEM image (second electronography) for the case in which the focal position of the electron beam is located on the film 42 is detected by the first electronography detector 21.

Next, in step S104, the MABF-STEM image (third electronography) for the case in which the focal position of the electron beam is located on the substrate 41 and the ADF-STEM image (fourth electronography) for the case in which the focal position of the electron beam is located on the substrate 41 are acquired. More particularly, the electron beam is irradiated by adjusting the focal position of the electron beam to be located on the substrate 41 of the sample 40, and the electron beam that is transmitted through the sample 40, or scattered in the sample 40, is detected by the first electronography detector 21 and the second electronography detector 22. Hence, the MABF-STEM image (third electronography) for the case in which the focal position of the electron beam is located on the substrate 41 is detected by the second electronography detector 22. In addition, the ADF-STEM image (fourth electronography) for the case in which the focal position of the electron beam is located on the substrate 41 is detected by the first electronography detector 21.

Next, in step S106, the amount of error between the image positions for the case in which the focal position of the electron beam is located on the film 42 and the case in which the focal position of the electron beam is located on the substrate 41 is computed. More particularly, the MABF-STEM image (first electronography) for the case in which the focal position of the electron beam is located on the film 42 and the MABF-STEM image (third electronography) for the case in which the focal position of the electron beam is located on the substrate 41 are input to the computing device 51 of the controller and analyzer 50. Thereafter, the computing device 51 computes the amount of error between the image positions, based on the MABF-STEM image (first electronography) for the case in which the focal position of the electron beam is located on the film 42 and the MABF-STEM image (third electronography) for the case in which the focal position of the electron beam is located on the substrate 41.

Next, in step S108, the alignment (or position matching) of the ADF-STEM image (second electronography) for the case in which the focal position of the electron beam is located on the film 42 and the ADF-STEM image (fourth electronography) for the case in which the focal position of the electron beam is located on the substrate 41 is performed. In other words, based on the amount of error between the image positions computed in step S106, the ADF-STEM image (fourth electronography) for the case in which the focal position of the electron beam is located on the substrate 41 is moved with respect to the ADF-STEM image (second electronography) for the case in which the focal position of the electron beam is located on the film 42. The process of step S108 is performed by the image position aligning device 52. Accordingly, it is possible to align (or match positions of) the ADF-STEM image (second electronography) for the case in which the focal position of the electron beam is located on the film 42 and the ADF-STEM image (fourth electronography) for the case in which the focal position of the electron beam is located on the substrate 41. The position of the ADF-STEM image (second electronography) for the case in which the focal position of the electron beam is located on the film 42 and the position of the ADF-STEM image (fourth electronography) for the case in which the focal position of the electron beam is located on the substrate 41 can be aligned (or matched) in this manner.

Next, in step S110, the brightness intensity of the ADF-STEM image (second electronography) for the case in which the focal position of the electron beam is located on the film 42 and the ADF-STEM image (fourth electronography) for the case in which the focal position of the electron beam is located on the substrate 41 is normalized. The image normalization device 53 performs this normalization process. More particularly, the normalization process causes the brightness of the heavy element in the substrate 41 to approximately match between the ADF-STEM image (second electronography) for the case in which the focal position of the electron beam is located on the film 42 and the ADF-STEM image (fourth electronography) for the case in which the focal position of the electron beam is located on the substrate 41.

Next, in step S112, the image computation is performed to subtract the ADF-STEM image (fourth electronography) for the case in which the focal position of the electron beam is located on the substrate 41 from the ADF-STEM image (second electronography) for the case in which the focal position of the electron beam is located on the film 42. As a result, in the image of the film 42 is obtained. More particularly, the image computing device 54 performs the image computation to subtract the ADF-STEM image (fourth electronography) for the case in which the focal position of the electron beam is located on the substrate 41 from the ADF-STEM image (second electronography) for the case in which the focal position of the electron beam is located on the film 42. The image of the film 42 that is obtained by this image computation is displayed on the display device 60 via through image output device 44. Accordingly, in the case in which the film 42 is formed from $LaCoO_3$, it is possible to know the structure of $LaCoO_3$ forming the film 42, that is, the positions of La and Co in $LaCoO_3$.

(Exemplary Implementation)

Next, a description will be given of one exemplary implementation according to one embodiment. In one exemplary implementation, the sample 40 uses, as the substrate 41, an $SrTiO_3(001)$ substrate, and $LaCoO_3$ including distortion is grown on the substrate 41, as the film 42.

Figure 11:
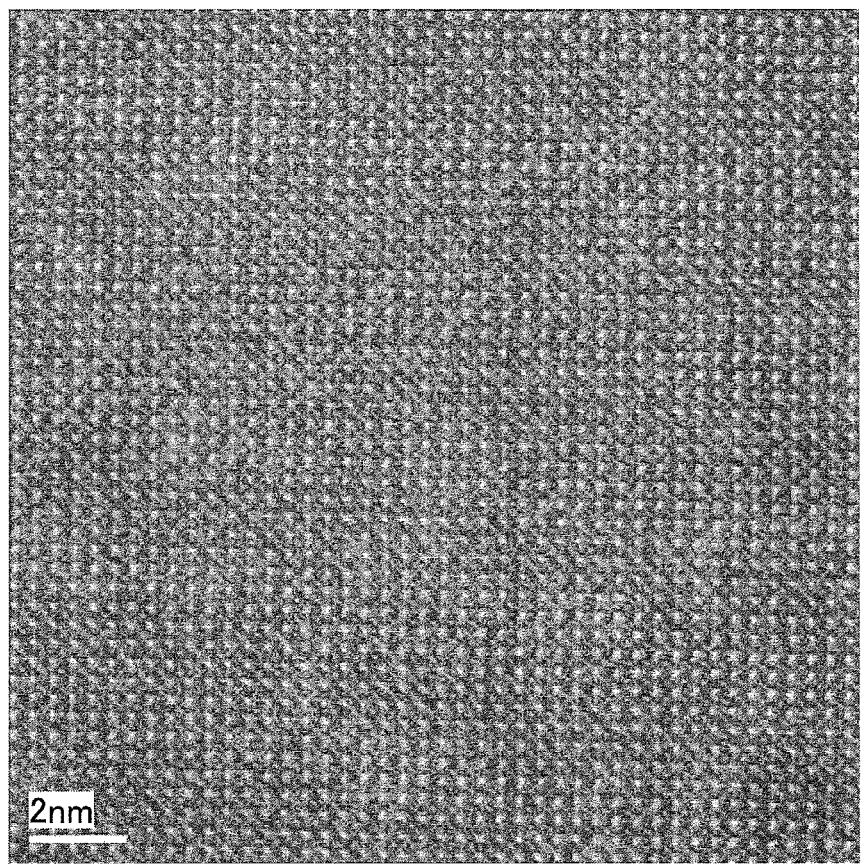
FIG. 11 is a diagram illustrating an ADF (Annular Dark-Field)-STEM image for the case in which the focal position of the electron beam is located on the film of the sample.
Figure 12:
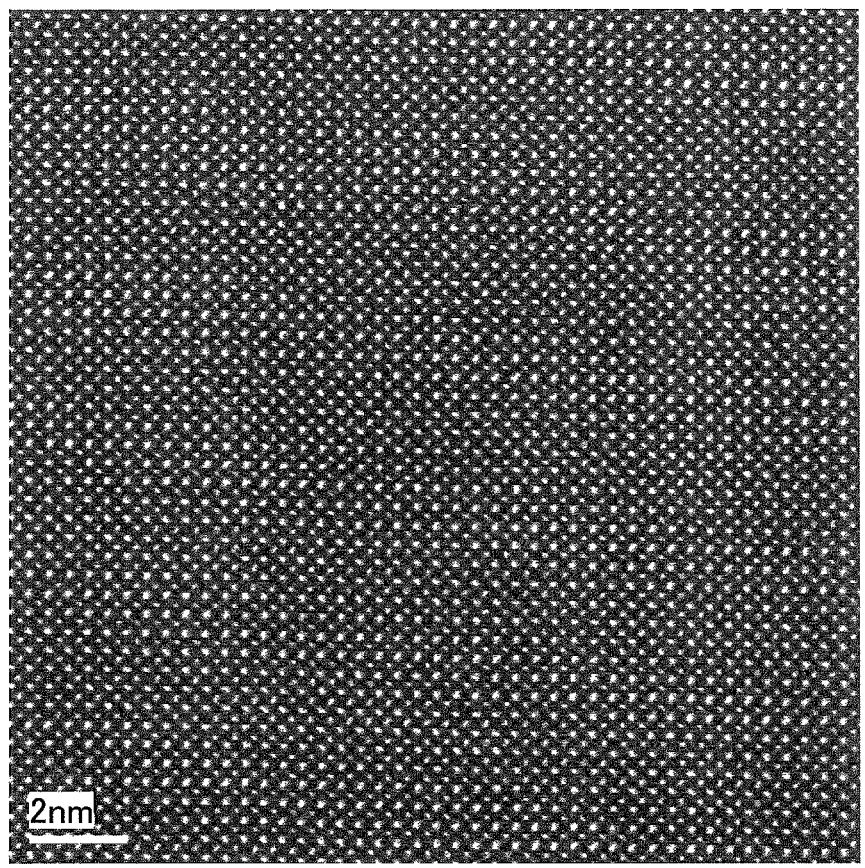
FIG. 12 is a diagram illustrating an ADF-STEM image for the case in which the focal position of the electron beam is located on the substrate of the sample.
Figure 13:
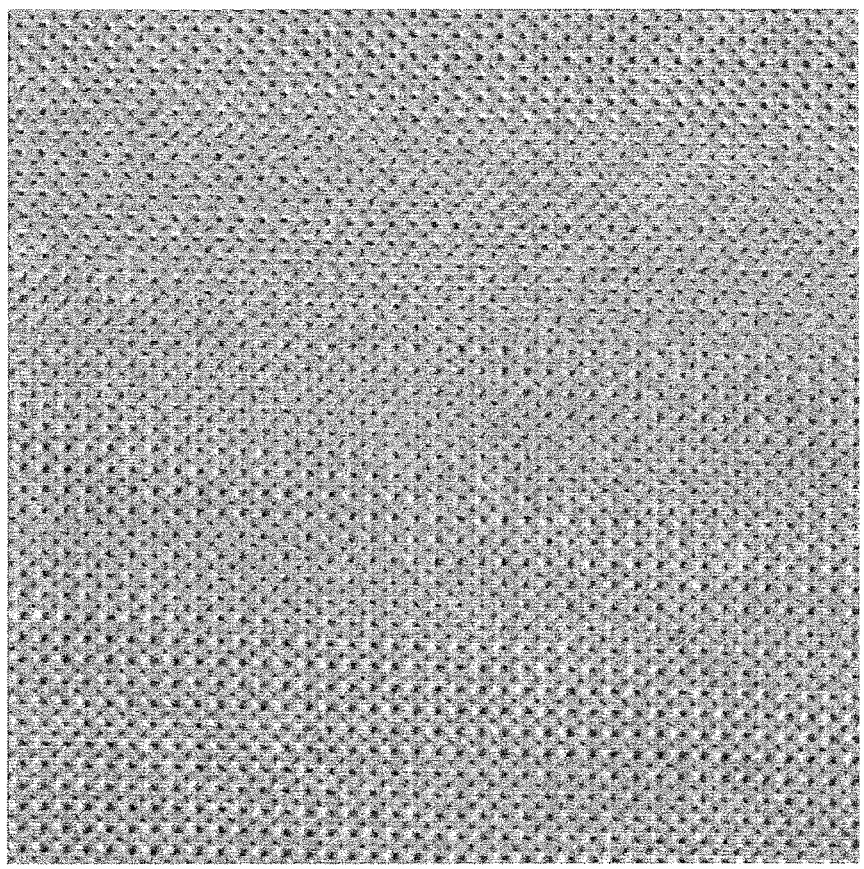
FIG. 13 is a diagram illustrating an image of the film obtained by an image computation in one embodiment.
Figure 14:
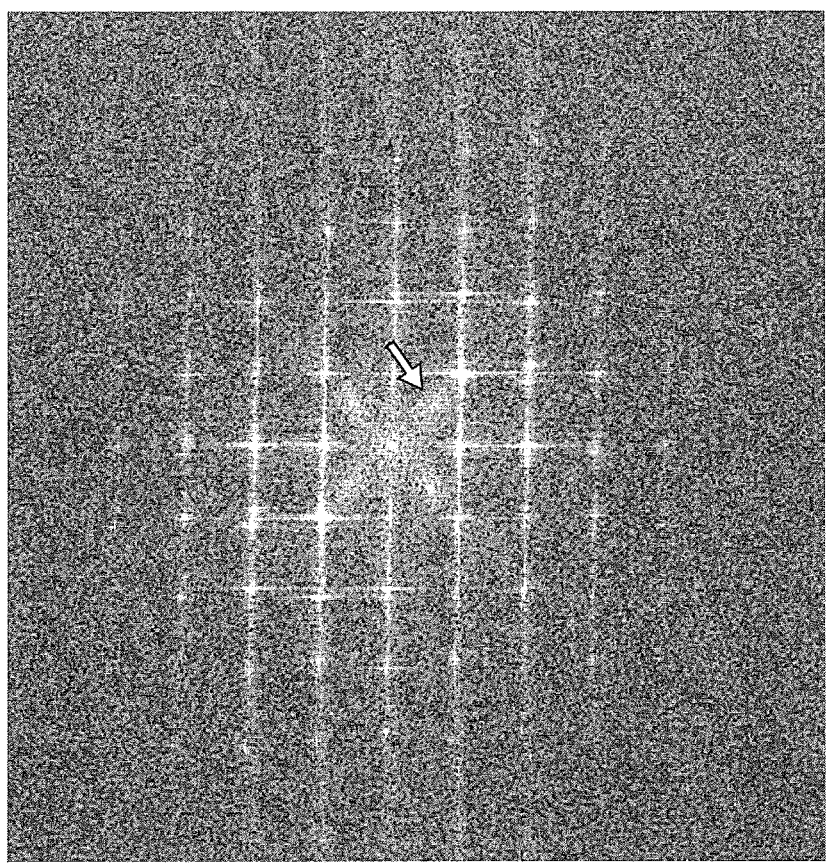
FIG. 14 is a diagram illustrating an FFT (Fast Fourier Transform) image illustrated in FIG. 13.

FIG. 11 illustrates the ADF-STEM image (second electronography) for the case in which the focal position of the electron beam is located on the film 42 of the sample 40, and FIG. 12 is a diagram illustrating the ADF-STEM image (fourth electronography) for the case in which the focal position of the electron beam is located on the substrate 41 of the sample 40. In one exemplary implementation, the amount of error between the image positions is first computed, based on the MABF-STEM image (first electronography) for the case in which the focal position of the electron beam is located on the film 42 and the MABF-STEM image (third electronography) for the case in which the focal position of the electron beam is located on the substrate 41. Next, the alignment (or position matching) of the ADF-STEM image (second electronography) for the case in which the focal position of the electron beam is located on the film 42 and the ADF-STEM image (fourth electronography) for the case in which the focal position of the electron beam is located on the substrate 41 is performed. Then, the normalization is performed to level the brightness of the images with respect to the ADF-STEM image (second electronography) for the case in which the focal position of the electron beam is located on the film 42 and the ADF-STEM image (fourth electronography) for the case in which the focal position of the electron beam is located on the substrate 41. Next, the image computation is performed to subtract the ADF-STEM image (fourth electronography) for the case in which the focal position of the electron beam is located on the substrate 41 from the ADF-STEM image (second electronography) for the case in which the focal position of the electron beam is located on the film 42. As a result, as illustrated in FIG. 13, it is possible to obtain the image of the film 42, which is made of $LaCoO_3$ and is grown on the substrate 41. FIG. 14 illustrates an image that is obtained by performing an FFT (Fast Fourier Transform) on the obtained image illustrated in FIG. 13.

According to one exemplary implementation, it is possible to obtain the image of an atomic arrangement in the film 42 that is deposited on the substrate 41. For this reason, it is possible to easily know the distortion or the like in the film 42 that is deposited on the substrate 41.

According to the disclosed analysis method using electron microscope, and the disclosed electron microscope, it is possible to definitely detect the atomic deviation and distortion of the film that is deposited on the substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analysis method using an electron microscope that includes an electron source, a first electronography detector, and a second electronography detector, the analysis method comprising:

accelerating and irradiating an electron beam emitted from the electron source on a sample so that a focal point of the electron beam is located on the sample, wherein the sample includes a substrate that includes fluorine or an element lighter than fluorine, and a film formed on a surface of the substrate;

detecting, by the first electronography detector, the electron beam transmitted through or scattered by the sample, to detect an ADF (Annular Dark-Field) image of the sample;

detecting, by the second electronography detector, the electron beam passing through the first electronography detector, to detect an MABF (Middle-Angle Bright-Field) image, adjusting the focal point of the electron beam to be located on the film of the sample, to obtain a first electronography by the second electronography detector and a second electronography by the first electronography detector;

adjusting the focal point of the electron beam to be located on the substrate of the sample, to obtain a third electronography by the second electronography detector and a fourth electronography by the first electronography detector;

aligning positions of the second electronography and the fourth electronography, based on the first electronography and the third electronography; and after the aligning, performing an image computation to subtract the fourth electronography from the second electronography, to obtain an image of the film.

2. The analysis method using the electron microscope as claimed in claim 1, wherein the aligning includes computing an amount of error between image positions in an image in the first electronography and an image in the third electronography, and moving the second electronography or the fourth electronography by the amount of error between the image positions computed by the computing, to align the positions of the second electronography and the fourth electronography.

3. The analysis method using the electron microscope as claimed in claim 2, wherein the computing computes an amount of error between a position of fluorine or an element lighter than fluorine in the first electronography, and a position of the fluorine or the element lighter than fluorine in the third electronography.

4. The analysis method using the electron microscope as claimed in claim 1, further comprising:

after the aligning, performing a normalization to level a brightness in the second electronography and the fourth electronography.

5. The analysis method using the electron microscope as claimed in claim 1, further comprising:

correcting a spherical aberration of the electron beam by a spherical aberration corrector that includes an objective lens and is arranged between the electron source and the objective lens.

6. The analysis method using the electron microscope as claimed in claim 1, further comprising:

controlling an electron beam scanner to cause the electron beam to scan the sample.

7. The analysis method using the electron microscope as claimed in claim 1, further comprising:

displaying, on a display device, the image of the film obtained by the performing the image computation.

8. The analysis method using the electron microscope as claimed in claim 7, wherein the displaying displays, as an image, information of a position of an element included in the material forming the film.

9. An electron microscope comprising:
an electron source that emits an electron beam;
an accelerator that accelerates the electron beam emitted from the electron source;
an objective lens that converges, on a sample, a focal point of the electron beam accelerated by the accelerator, wherein the sample includes a substrate that includes fluorine or an element lighter than fluorine, and a film formed on a surface of the substrate;
a first electronography detector, including an aperture at a center part thereof, that detects the electron beam transmitted through or scattered by the sample, to detect an ADF (Annular Dark-Field) image of the sample;
a second electronography detector that detects the electron beam passing through the aperture of the first electronography detector, to detect an MABF (Middle-Angle Bright-Field) image; and
a processor configured to perform a process including
adjusting the focal point of the electron beam to be located on the film of the sample, to obtain a first electronography by the second electronography detector and a second electronography by the first electronography detector;
adjusting the focal point of the electron beam to be located on the substrate of the sample, to obtain a third electronography by the second electronography detector and a fourth electronography by the first electronography detector;
aligning positions of the second electronography and the fourth electronography, based on the first electronography and the third electronography; and
after the aligning, performing an image computation to subtract the fourth electronography from the second electronography, to obtain an image of the film.

10. The electron microscope as claimed in claim 9, wherein the processor performs the process further including a normalization to level a brightness in the second electronography and the fourth electronography.

11. The electron microscope as claimed in claim 9, further comprising:
a spherical aberration corrector, arranged between the electron source and the objective lens, and configured to correct a spherical aberration of the electron beam.

12. The electron microscope as claimed in claim 9, further comprising:
an electron beam scanner that causes the electron beam to scan the sample.

13. The electron microscope as claimed in claim 9, wherein the processor performs the process further including displaying, on a display device, the image of the film obtained by the performing the image computation.

14. The electron microscope as claimed in claim 13, wherein the displaying displays, as an image, information of a position of an element included in the material forming the film.

* * * * *